United States Patent
Zeng et al.

(10) Patent No.: US 9,819,263 B2
(45) Date of Patent: Nov. 14, 2017

(54) POWER CONVERTER AND METHOD FOR MANUFACTURING THE SAME

(71) Applicant: DELTA ELECTRONICS, INC., Taoyuan (TW)

(72) Inventors: Jian-Hong Zeng, Taoyuan (TW); Shou-Yu Hong, Taoyuan (TW); Xiao-Ni Xin, Taoyuan (TW); Pei-Qing Hu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/286,542

(22) Filed: Oct. 5, 2016

(65) Prior Publication Data

US 2017/0104410 A1    Apr. 13, 2017

(30) Foreign Application Priority Data

Oct. 9, 2015    (CN) .......................... 2015 1 0648280

(51) Int. Cl.
*H02M 3/156*    (2006.01)
*H05K 1/02*    (2006.01)
(Continued)

(52) U.S. Cl.
CPC ............ *H02M 3/156* (2013.01); *H01F 27/24* (2013.01); *H01F 27/28* (2013.01); *H05K 1/028* (2013.01); *H05K 1/111* (2013.01); *H05K 1/18* (2013.01); *H05K 1/181* (2013.01); *H05K 3/22* (2013.01); *H05K 3/305* (2013.01); *H05K 3/4038* (2013.01); *H05K 1/145* (2013.01); *H05K 1/147* (2013.01);
(Continued)

(58) Field of Classification Search
CPC ........ H01F 27/24; H01F 27/28; H02M 3/156; H05K 1/111; H05K 1/18; H05K 1/181; H05K 3/22; H05K 3/4038; H05K 1/028
USPC .......................................................... 361/749
See application file for complete search history.

(56) References Cited

U.S. PATENT DOCUMENTS 9,030,027 B2 * 5/2015 Zeng ...................... H05K 1/141
  257/777
2009/0175014 A1 * 7/2009 Zeng ...................... H05K 1/141
  361/782
(Continued)

FOREIGN PATENT DOCUMENTS

CN    203057001 U    7/2013
TW    I242820 B    11/2005
(Continued)

*Primary Examiner* — Timothy Thompson
*Assistant Examiner* — Charles Pizzuto
(74) *Attorney, Agent, or Firm* — CKC & Partners Co., Ltd.

(57) ABSTRACT

A power converter includes a carrier, a first electronic component, a second electronic component, and a connection part. The first electronic component is disposed on the bottom surface of the carrier. The second electronic component is disposed on the top surface of the carrier. A first terminal of the connection part is coupled to the top surface or the bottom surface of the carrier. A second terminal of the connection part is a bonding pad and attached to the first electronic component's surface apart from the carrier. The carrier is disposed at ⅓ to ⅔ of a height of the power-converter. The connection part is fabricated by mechanical support of the first electronic component.

24 Claims, 20 Drawing Sheets

(51) Int. Cl.
*H05K 1/18* (2006.01)
*H05K 3/22* (2006.01)
*H01F 27/24* (2006.01)
*H05K 3/30* (2006.01)
*H05K 1/11* (2006.01)
*H01F 27/28* (2006.01)
*H05K 3/40* (2006.01)
*H05K 1/14* (2006.01)

(52) U.S. Cl.
CPC ............... *H05K 2201/1003* (2013.01); *H05K 2201/10946* (2013.01); *H05K 2203/02* (2013.01); *H05K 2203/0228* (2013.01)

(56) References Cited

U.S. PATENT DOCUMENTS

2014/0085848 A1* 3/2014 Zeng ................ H05K 1/141
    361/768
2016/0366780 A1* 12/2016 Liang ................ H02M 3/04

FOREIGN PATENT DOCUMENTS

| TW | 201330190 A | 7/2013 |
| TW | I412655 B | 10/2013 |
| TW | I471357 B | 2/2015 |

\* cited by examiner

2300

```
┌─────────────────────────────────────┐
│ Bond a first electronic component on a lead │
│ frame, where the lead frame comprises │
│ a retaining part and a connection part │
│               2310                  │
└─────────────────────────────────────┘
                  │
                  ▼
┌─────────────────────────────────────┐
│ Cut off the retaining part of the lead frame │
│               2320                  │
└─────────────────────────────────────┘
                  │
                  ▼
┌─────────────────────────────────────┐
│ Curve the connection part by mechanical │
│ support of the first electronic component │
│ to fix the connection part at the first │
│         electronic component        │
│               2330                  │
└─────────────────────────────────────┘
                  │
                  ▼
┌─────────────────────────────────────┐
│ Connect the first electronic component at │
│      a lower surface of the carrier │
│               2340                  │
└─────────────────────────────────────┘
                  │
                  ▼
┌─────────────────────────────────────┐
│ Bond a second electronic component at │
│     an upper surface of the carrier │
│ to form the power converter, where the │
│    carrier is disposed at 1/3 to 2/3 │
│    of the height of the power converter │
│               2350                  │
└─────────────────────────────────────┘
```

Fig. 23

POWER CONVERTER AND METHOD FOR MANUFACTURING THE SAME

RELATED APPLICATIONS

This application claims priority to Chinese Patent Application No. 201510648280.1, filed on Oct. 9, 2015, which is herein incorporated by reference.

BACKGROUND

Field of Disclosure

The present disclosure relates to a power converting technology, and more particularly, to a power converter and a method for manufacturing the same.

Description of Related Art

With the development of smart life technology, demands for data processing have been increased. The averaged energy consumption for data processing throughout the world achieves hundreds of billions of kilowatt-hours or even trillions of kilowatt-hours per year. Furthermore, a large data center is often has an occupied area up to ten thousands of square meters. Therefore, high efficiency and high power density are key factors for sustainable development of industry.

The key to the function of the data center is a server, where the motherboard usually consists of data processing chips such as CPU, chipsets and memory and their power supply source and essential peripheral components. The power supply needs for chips are power sources with low voltage and high current. Therefore, power sources for directly providing power to chips are needed for reducing the effects of loss and resistance of output wires, and these power sources are called points of the load (POL).

According to various system architectures, the inputs of the POL include 12V, 48V or even 400V. Because of low voltage and high current of the POL, the volume and resistance of the pins thereof may have very direct effect on the power density and the efficiency of the POL power source. Therefore, how to design the pins is one of the keys for such kind of power converter. If wide application range is considered for designing the pins, the size of the power converter is larger, the cost is higher, and the power consumption is greater. If small size, low cost and low consumption of the power converter are considered for designing the pins, the application range becomes narrower.

In view of the foregoing, there exist problems and disadvantages in the existing products that await further improvement. However, those skilled in the art sought vainly for a solution.

SUMMARY

The following summary presents a simplified summary of the disclosure in order to provide a basic understanding to the reader. This summary is not an extensive overview of the disclosure and it does not identify key/critical elements of the present disclosure or delineate the scope of the present disclosure.

The present disclosure provides a power converter, which addresses the problem existed in the prior art.

Another technical aspect of the present disclosure is a power converter. The power converter includes a carrier, a first electronic component, a second electronic component and a first connection part. The carrier includes an upper surface and a lower surface, and the first connection part includes a first terminal and a second terminal. The first electronic component is disposed at the lower surface of the carrier, and the second electronic component is disposed at the upper surface of the carrier. The first terminal of the first connection part is electrically connected to the upper surface or the lower surface of the carrier. The second terminal of the first connection part is a bonding pad attached to a surface of the first electronic component apart from the carrier. The carrier is disposed at ⅓ to ⅔ of a height of the power converter. The first connection part is fabricated by mechanical support of the first electronic component.

Another technical aspect of the present disclosure is a method for manufacture a power converter, including the following steps: bonding a first electronic component on a lead frame which includes a retaining part and a connection part; cutting off the retaining part of the lead frame; curving the connection part by mechanical support of the first electronic component to fix the connection part at the first electronic component; connecting the first electronic component at a lower surface of a carrier; and bonding a second electronic component at an upper surface of the carrier to form the power converter, where the carrier is disposed at ⅓ to ⅔ of a height of the power converter.

Therefore, in view of the foregoing, embodiments of the present disclosure provide a power converter and a method for manufacturing the same to improve the problems associated with the difficulty in simultaneously considering wide application range, small size, low cost and low consumption.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The present disclosure can be more quite understood by reading the following detailed description of the embodiment, with reference made to the accompanying drawings as follows:

FIG. 23 illustrates a flowchart of a method of fabricating a power converter in accordance with embodiments of the present disclosure.

Figure 1:
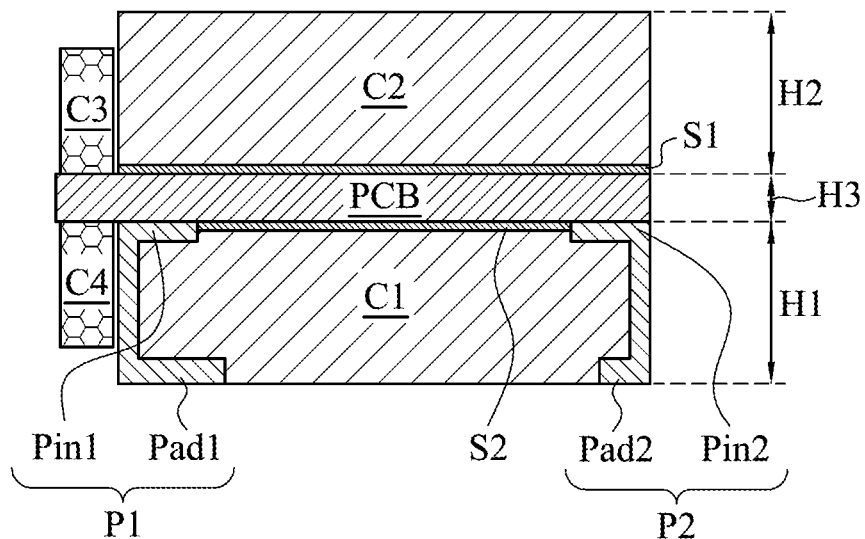
FIG. 1 illustrates a schematic diagram of a power converter in accordance with embodiments of the present disclosure.

In accordance with common practice, the various described features/elements are not drawn to scale but instead are drawn to best illustrate specific features/elements relevant to the present disclosure. Also, like reference numerals and designations in the various drawings are used to indicate like elements/parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art.

FIG. 1 illustrates a schematic diagram of a power converter in accordance with embodiments of the present disclosure. As shown in FIG. 1, the power converter 100 includes a carrier PCB, a first electronic component C1, a second electronic component C2, a first connection part P1 and a second connection part P2. Those skilled in the art will appreciate that, in the embodiment shown in FIG. 1, the power converter 100 includes the first connection part P1 and the second connection part P2. However, the present disclosure is not limited thereto. In another embodiment, the power converter 100 may only include the first connection part P1, and the second terminal Pad1 of the first connection part P1 is a bonding pad attached to a surface of the first electronic component C1 apart from the carrier PCB. Substantially, as can be known from FIG. 1, the terminal structure of the second connection part P2 and the first connection part P1 is substantially the same or similar. Furthermore, the carrier PCB includes a top surface S1 and a bottom surface S2, the first connection part P1 includes a first terminal Pin1 and a second terminal Pad1, and the second connection part P2 includes a first terminal Pin2 and a second terminal Pad2. For implementing the present disclosure, the carrier PCB may be a printed circuit board, and the first connection part P1 and the second connection part P2 may be pins. However, the present disclosure is not limited thereto, which is only used for illustratively describe one of the ways for implementing the present disclosure.

With respect to structure, the first electronic component C1 is disposed at the bottom surface S2 of the carrier PCB, and the second electronic component C2 is disposed at the top surface S1 of the carrier PCB. The first terminal Pin1 of the first connection part P1 is connected to the bottom surface S2 of the carrier PCB, and at this time, the first connection part P1 and the carrier PCB are connected by using surface mount technology (SMT). Alternatively, in another embodiment, the first terminal Pin1 of the first connection part P1 is connected to the top surface S1 of the carrier PCB, and at this time, the first connection part P1 and the carrier PCB are connected by using insertion connection, for example, the carrier PCB has a through hole, the first terminal Pin1 inserts the carrier PCB from the bottom surface S2 to the top surface S1. The second terminal Pad1 of first connection part P1 is a bonding pad attached to the surface of the first electronic component C1 apart from the carrier PCB. As can be seen from the figure, the carrier PCB can be disposed at ⅓ to ⅔ of the height of the power converter. In addition, the first connection part P1 is fabricated by mechanical support of the first electronic component C1.

Moreover, the second terminal Pad1 of the first connection part P1 may be connected to an external device (not shown). Therefore, the external device may be electrically connected to the carrier PCB through the second terminal Pad1 and the first terminal Pin1 of the first connection part P1. Similarly, the first terminal Pin2 of the second connection part P2 is connected to the bottom surface S2 of the carrier PCB. Alternatively, in another embodiment, the first terminal Pin2 of the second connection part P2 is connected to the top surface S1 of the carrier PCB. The second terminal Pad2 of the second connection part P2 is a bonding pad attached to a surface of the first electronic component C1 apart from the carrier PCB. In addition, the second terminal Pad2 of the second connection part P2 can be used to connect with an external device (not shown). Therefore, the external device can be electrically connected with the carrier PCB through the second terminal Pad2 and the first terminal Pin2 of the second connection part P2. In addition, the second connection part P2 is fabricated by mechanical support of the first electronic component C1.

In another embodiment, a plurality of first electronic components (e.g. electronic components C1 and C4) may be attached on the bottom surface S2 of the carrier PCB, and a first height H1 is defined as the vertical height between a highest one of the first electronic components (e.g. the electronic component C1) and the bottom surface S2 of the carrier PCB. A plurality of second electronic components (e.g. electronic components C2, C3) may be attached on the top surface S1 of the carrier PCB, and a second height H2 is defined as the vertical height between a highest one of the second electronic components (e.g. the electronic component C2) and the top surface S1 of the carrier PCB. The height of the power converter 100 is calculated by adding the first height H1, the second height H2 and the thickness H3 of the carrier PCB, and the carrier PCB is disposed at ⅓ to ⅔ of the height of the power converter. However, the power converter structure of the present disclosure is not limited to that shown in FIG. 1, which is only used for illustratively describe one of the ways for implementing the present disclosure.

In one embodiment, the connection parts P1 and P2 are fabricated by mechanical support of the first electronic component C1, and thus the gap between the connection parts P1 and P2 and the first electronic component C1 is close to zero. Moreover, the connection parts P1 and P2 are fabricated by mechanical support of the first electronic component C1, and thus the connection parts P1 and P2 themselves can be determined according to electrical requirements without additionally considering their mechanical strengths and mounting requirements. Therefore, according to embodiments of the disclosure, the connection parts P1 and P2 of the power converter have small body size, and the space needed for mounting is reduced accordingly, thereby substantially improving the space utilization ratio of the power converter to achieve higher power density. Furthermore, only electrical connection is considered for the size of the connection parts P1 and P2, and thus less consumption can be achieved. In addition, the size of the connection parts P1 and P2 is small, and thus the manufacture cost can be further reduced.

In another embodiment, the connection parts P1 and P2 may be directly bonded with the first electronic component C1 through an adhesive. In a further embodiment, the first electronic component C1 and the second electronic component C2 are symmetric with respect to the carrier PCB. As such, the resource of the carrier PCB can be quite utilized, and the uniform strain distribution of throughout the converter can be benefited. Therefore, no additional strain solution is needed, for avoiding the problem of increasing of the power converter volume resulted from using an additional strain solution. In a further embodiment, the definition of the symmetry mentioned above may be that, the second height H2 is not greater than twice the first height H1, or the first height H1 is not greater than twice the second height H2. In one embodiment, the height of the first electronic component C1 equals to the height of the second electronic component C2.

In another embodiment, the connection parts P1 and P2 may use a lead frame and are fabricated by mechanical support of the first electronic component C1. In a further embodiment, the connection part P1, the connection part P2 and the carrier PCB are connected by using surface mount technology (SMT).

Figure 2:
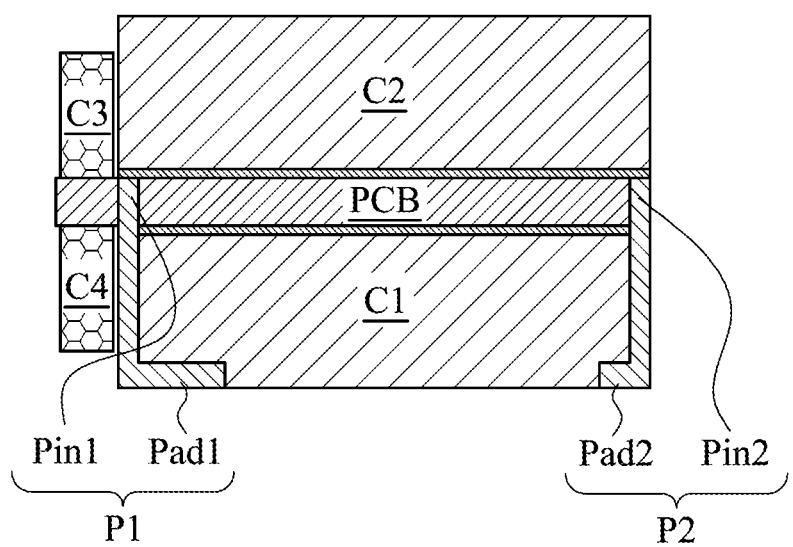
FIG. 2 illustrates a schematic diagram of a power converter in accordance with embodiments of the present disclosure.

FIG. 2 illustrates a schematic diagram of a power converter in accordance with embodiments of the present disclosure. In comparison with the power converter 100 shown in FIG. 1, the connection parts P1, P2 and the carrier PCB of the power converter 200 of FIG. 2 are connected by using insertion connection. For example, the connection parts P1 and P2 are connected to the first electronic component C1, and the connection parts P1 and P2 penetrate through the carrier PCB for being connected to the second electronic component C2. If the surface mount technology for the connection parts P1, P2 and the carrier PCB shown in FIG. 1 is replaced by the insertion connection shown in FIG. 2, the connection between the connection parts P1, P2 and the carrier PCB can be more stable, so as to reduce the transmission loss from the carrier PCB to the connection parts P1 and P2, and such connection may be adapted to the conditions with low voltage and high current. In addition, as shown in FIG. 2, the connection part P2 may be at the outermost side of the carrier PCB, i.e., the outermost side of the power converter 200. As such, the area of the carrier PCB can be further reduced, so as to improve the power density.

In another embodiment, an electrical connection is not necessarily required between the connection parts P1, P2 and the first electronic component C1, and thus the first electronic component C1 may be an entire electronic component, such as a metal oxide semiconductor field effect transistor (MOSFET) or an integrated circuit. In addition, the first electronic component C1 may also be an entire combination of electronic components, such as a power module. Moreover, the first electronic component C1 may also include a part of a core of the magnetic element. In a further embodiment, the first electronic component C1, the second electronic component C2 and the carrier PCB are used to form an inductor element, and the first electronic component C1 and the second electronic component C2 are respectively parts of a core of the inductor element. At this time, the power converter 200 is a boost circuit or a buck circuit.

In a further embodiment, the first electronic component C1, the second electronic component C2 and the carrier PCB are used to form a transformer, and the first electronic component C1 and the second electronic component C2 are respectively parts of a core of the transformer. For example, the power converter 200 may be an isolated DC/DC converter.

Figure 3:
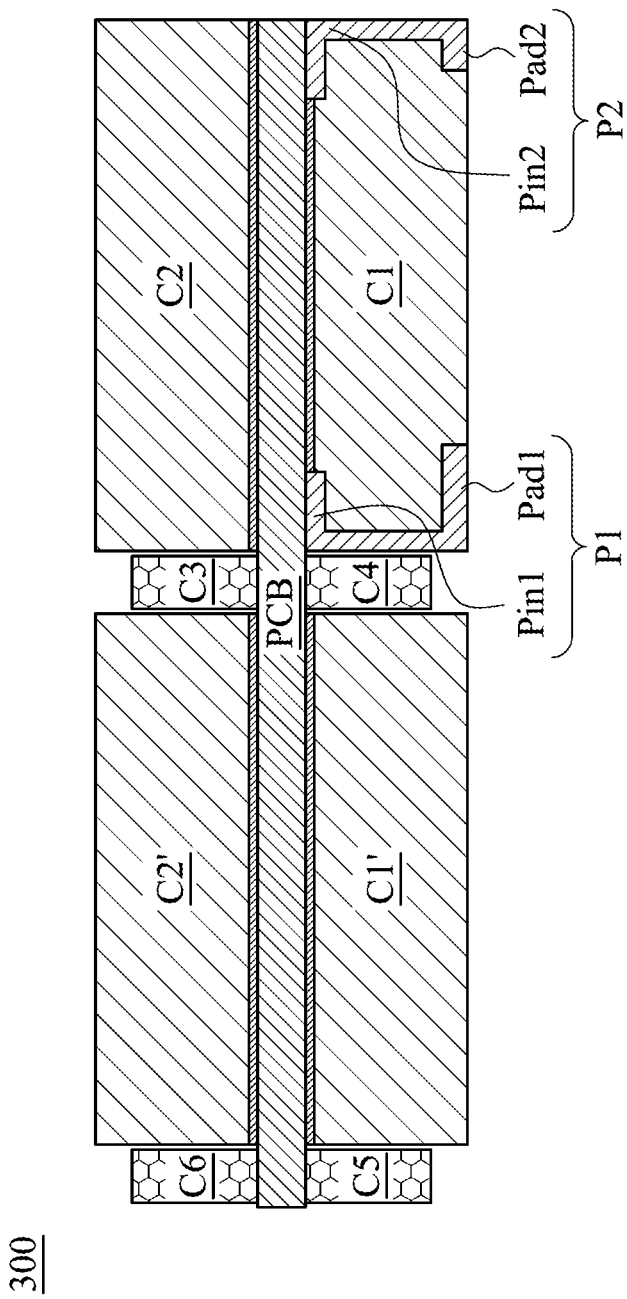
FIG. 3 illustrates a schematic diagram of a power converter in accordance with embodiments of the present disclosure.

FIG. 3 illustrates a schematic diagram of a power converter in accordance with embodiments of the present disclosure. In comparison with the power converter 100 shown in FIG. 1, the power converter 300 of FIG. 3 further includes a third electronic component C1' and a fourth electronic component C2' respectively disposed at the bottom surface S2 and the top surface S1 of the carrier PCB, where the third electronic component C1', the fourth electronic component C2' and the carrier PCB are used to form a transformer, and the third electronic component C1' and the fourth electronic component C2' are respective parts of a core of the transformer.

Figure 4:
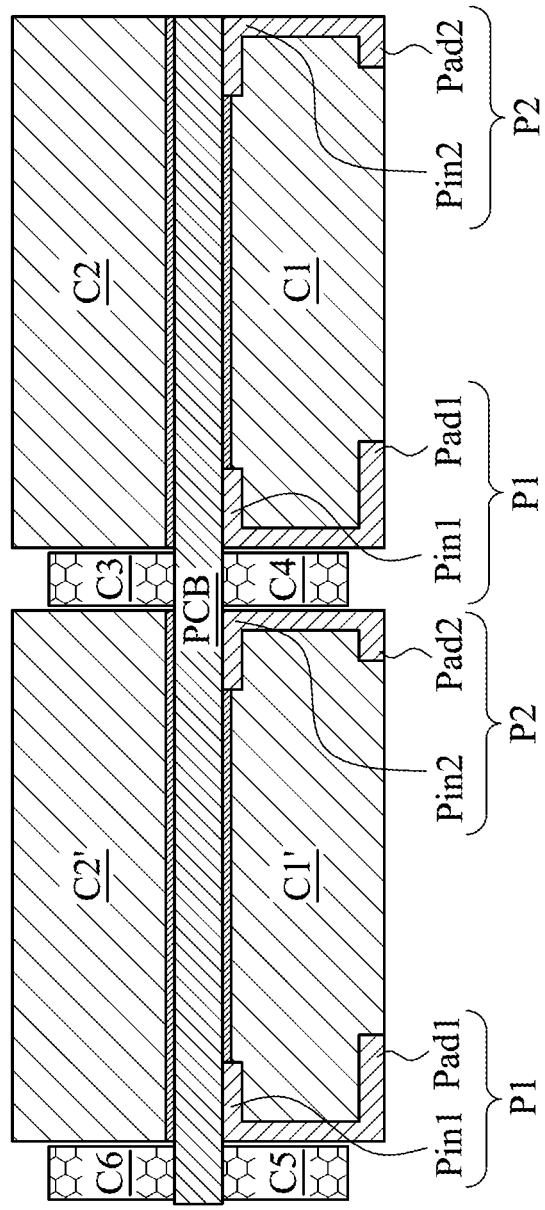
FIG. 4 illustrates a schematic diagram of a power converter in accordance with embodiments of the present disclosure.

FIG. 4 illustrates a schematic diagram of a power converter in accordance with embodiments of the present disclosure. In comparison with the power converter 300 shown in FIG. 3, the power converter 400 in FIG. 4 includes a plurality of first connection parts P1 and a plurality of second connection parts P2, where each of the first connection parts P1 includes a first terminal Pin1 and a second terminal Pad1, and each of the second connection part P2 includes a first terminal Pin2 and a second terminal Pad2. With respect to structure, the first terminals Pin1 of the first connection parts P1 are respectively connected to the first electronic component C1 and the third electronic component C1', and are connected to the carrier PCB. The second terminal Pad1 of the first connection part P1 is used to connect with an external device (not shown). The first terminals Pin2 of the second connection parts P2 are respectively connected to the first electronic component C1 and the third electronic component C1', and are connected to the carrier PCB. The second terminal Pad2 of the second connection part P2 is used to connect with an external device (not shown). As can be seen from the drawing, the power converter structure of the present disclosure is symmetric, and thus manufacturing of the first connection part P1 and the second connection part P2 of the power converter is simpler. In addition, as the power converters 300 and 400 shown in FIG. 3 and FIG. 4, in the present disclosure, the first connection part P1 and the second connection part P2 can be selectively fabricated on a single component (e.g. the first electronic component C1) or on several components (e.g. the first electronic component C1 and the third electronic component C1') according to practical needs.

In another embodiment, the third electronic component C1' and the fourth electronic component C2' form a core of the transformer through the carrier PCB. In a further embodiment, the third electronic component C1' and the fourth electronic component C2' form an inductor core through the carrier PCB.

In a further embodiment, if the first electronic component C1 and the second electronic component C2 form a core of the transformer and the third electronic component C1' and the fourth electronic component C2' form an inductor core, the power converter 400 includes an isolated DC/DC transformer and a buck power converter, thereby forming a two-stage architecture. Such architecture is suitable to a high input/output condition, such as 48V and 400V.

Figure 5:
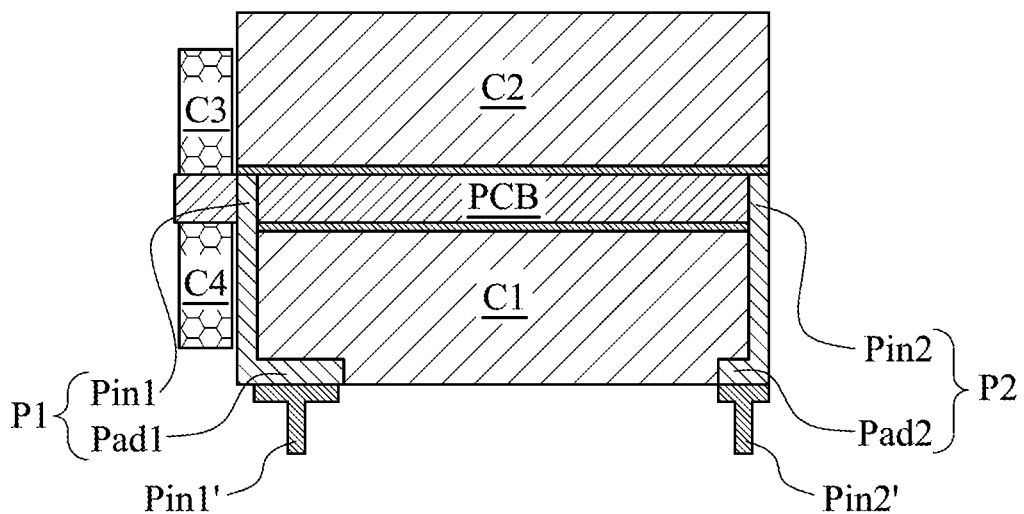
FIG. 5 illustrates a schematic diagram of a power converter in accordance with embodiments of the present disclosure.

FIG. 5 illustrates a schematic diagram of a power converter in accordance with embodiments of the present disclosure. In comparison with the power converter 200 shown in FIG. 2, the power converter 500 of FIG. 5 further includes at least one insertion pin (e.g. Pin1' or Pin2') installed at the second terminal Pad1 of the first connection part P1 for converting bonding pad connection into insertion connection.

Figure 6:
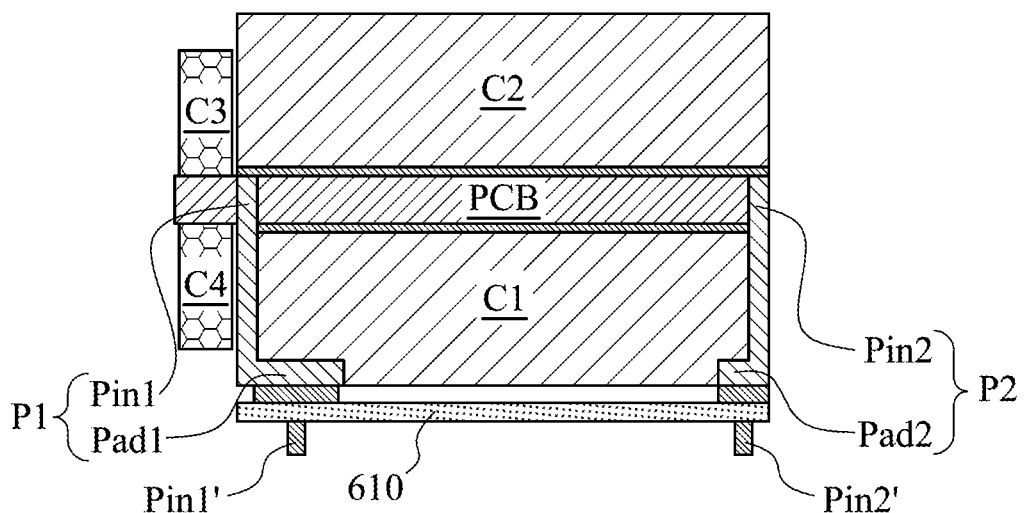
FIG. 6 illustrates a schematic diagram of a power converter in accordance with embodiments of the present disclosure.

FIG. 6 illustrates a schematic diagram of a power converter in accordance with embodiments of the present disclosure. In comparison with the power converter 500 shown in FIG. 5, in the power converter 600 of FIG. 6, the second terminals Pad1 and Pad2 of the connection parts P1 and P2 respectively correspond to the insertion pins Pin1' and Pin2', and the insertion pins Pin1' and Pin2' are fixed through the bracket 610. This is because the mutual location between the insertion pins Pin1' and Pin2' disposed simultaneously is more difficult. Therefore, the bracket 610 may be used to prefix the insertion pins Pin1' and Pin2', and then the insertion pins Pin1' and Pin2' are disposed on the connection parts P1 and P2 simultaneously. As such, the manufacturing difficulty can be simplified, and the accuracy may be effectively controlled.

Figure 7:
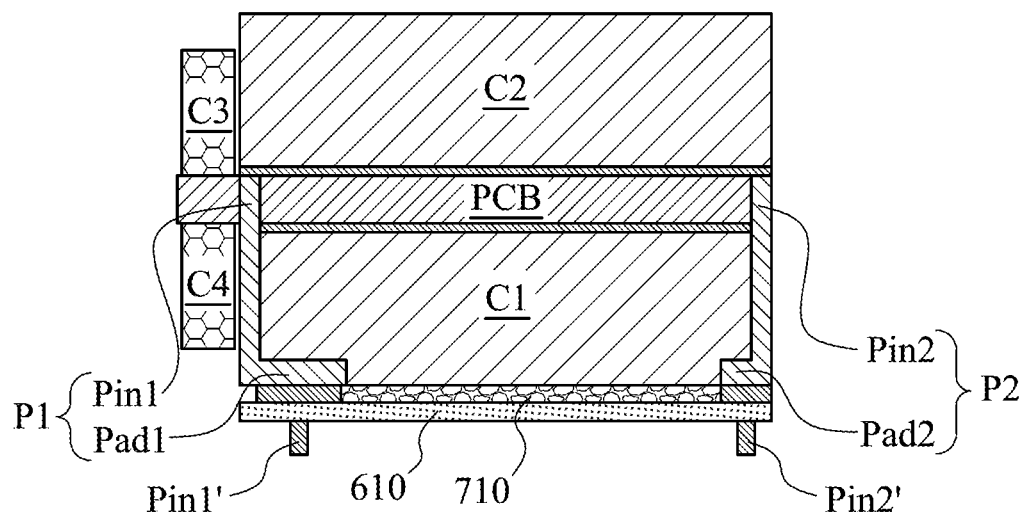
FIG. 7 illustrates a schematic diagram of a power converter in accordance with embodiments of the present disclosure.

FIG. 7 illustrates a schematic diagram of a power converter in accordance with embodiments of the present disclosure. In comparison with the power converter 600 shown in FIG. 6, the power converter 700 of FIG. 7 further includes a bonding layer 710, and the bonding layer 710 may be used to bond the first electronic component C1 and the bracket 610, so as to prevent the insertion pins Pin1' and Pin2' from detaching when in use. In one embodiment, the connection part P1 or the connection part P2 may be fabricated by using a lead frame.

Figure 8:
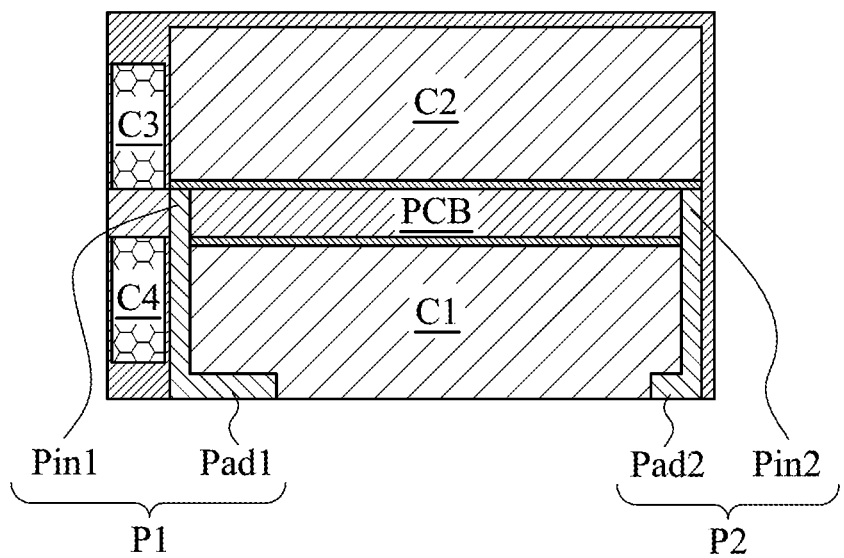
FIG. 8 illustrates a schematic diagram of a power converter in accordance with embodiments of the present disclosure.

FIG. 8 illustrates a schematic diagram of a power converter in accordance with embodiments of the present disclosure. As shown in FIG. 8, the power converter 800 is a symmetric structure, e.g., the first electronic component C1 and the second electronic component C2 are symmetric with respect to the carrier PCB, and thus the power converter 800 is suitable for a molding process, making the structure of power converter 800 more rigid and reliable and has better heat dissipation ability.

Figure 9:
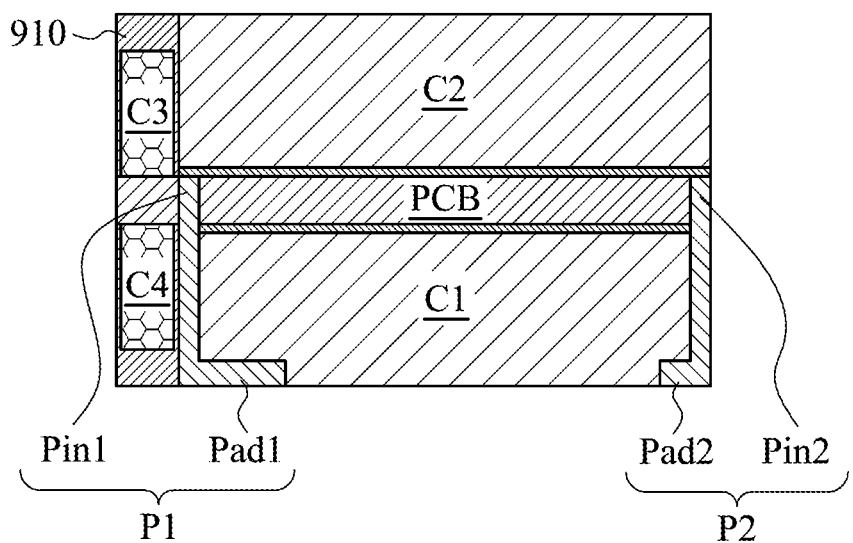
FIG. 9 illustrates a schematic diagram of a power converter in accordance with embodiments of the present disclosure.

FIG. 9 illustrates a schematic diagram of a power converter in accordance with embodiments of the present disclosure. In comparison with FIG. 8, in FIG. 9, a grinding process is performed on a molding material 910 on the power converter 900, until a part of the power converter 900 is externally exposed. For example, the grinding process is performed until the second electronic component C2 is exposed, for further reducing the size and improving the heat dissipation ability of the power converter 900.

Figure 10:
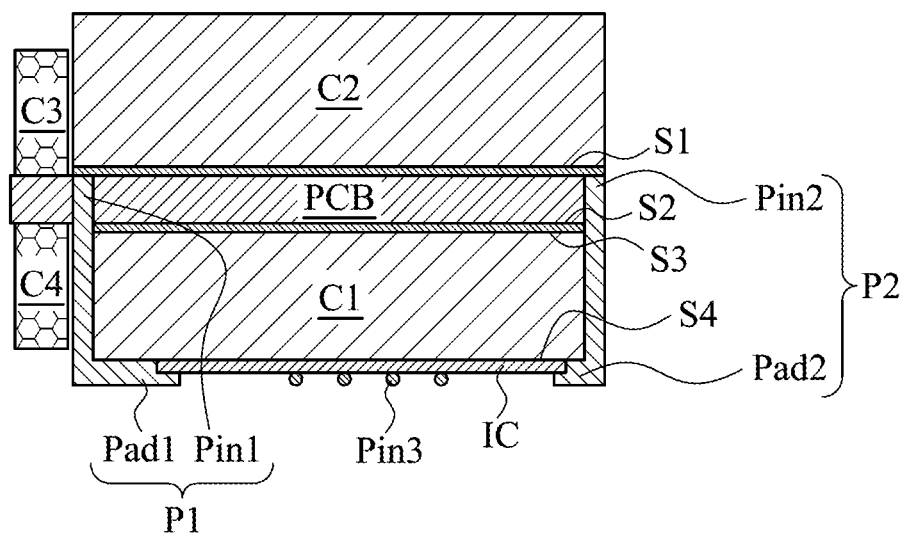
FIG. 10 illustrates a schematic diagram of a power converter in accordance with embodiments of the present disclosure.

FIG. 10 illustrates a schematic diagram of a power converter in accordance with embodiments of the present disclosure. As shown in FIG. 10, the first electronic component C1 includes a first surface S3 and a second surface S4, and the first surface S3 of the first electronic component C1 is disposed at the bottom surface S2 of the carrier PCB. In addition, the power converter further includes a chip IC disposed at the second surface S4 of the first electronic component C1 (i.e. disposed at the surface of the first electronic component C1 apart from the carrier PCB). Moreover, the chip IC includes one or more pins (e.g. the pin Pin3), and as such, signals of the chip IC may be transmitted through the first connection part P1 and the second connection part P2 or through one or more pins (e.g. the pin Pin3).

Figure 11:
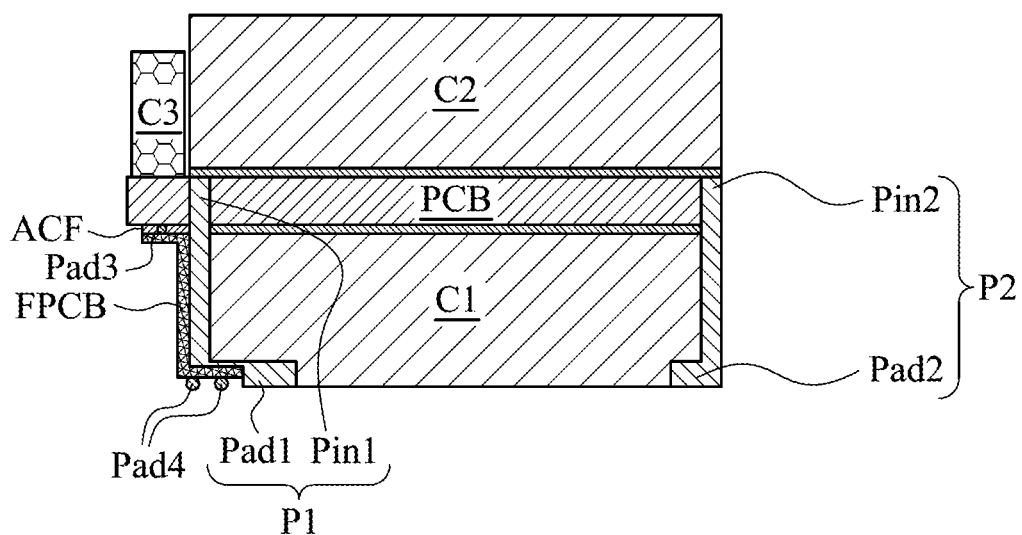
FIG. 11 illustrates a schematic diagram of a power converter in accordance with embodiments of the present disclosure.

FIG. 11 illustrates a schematic diagram of a power converter in accordance with embodiments of the present disclosure. As shown in FIG. 11, the power converter 1100 further includes a flexible printed circuit board FPCB disposed at an external side of the first connection part P1. A terminal Pad3 of the flexible printed circuit board FPCB is connected to the carrier PCB, and the other terminal Pad4 may be mechanically connected to the second terminal Pad1 of the first connection part P1, for example, the second terminal Pad1 is used to provide mechanical support for the terminal Pad4 of the flexible printed circuit board FPCB. In addition, the terminal Pad4 may be also electrically connected to the second terminal Pad1 so as to transmit signal therebetween. Because signal can be transmitted from the carrier PCB to the second terminal Pad1 of the first connection part P1 by the flexible printed circuit board FPCB, the problem of more signal pins can be solved. In addition, the other terminal Pad4 of the flexible printed circuit board FPCB can be connected to an external device (not shown), and thus the flexible printed circuit board FPCB can be used as a connector for connecting the carrier PCB and an external device. In a further embodiment, the flexible printed circuit board FPCB may be mounted at the carrier PCB through an anisotropic conductive film ACF. Because the anisotropic conductive film ACF is anisotropic conductive, if the anisotropic conductive film ACF is used to connect the flexible printed circuit board FPCB and the carrier PCB, multi-signal connection with high accuracy can be realized.

Figure 12:
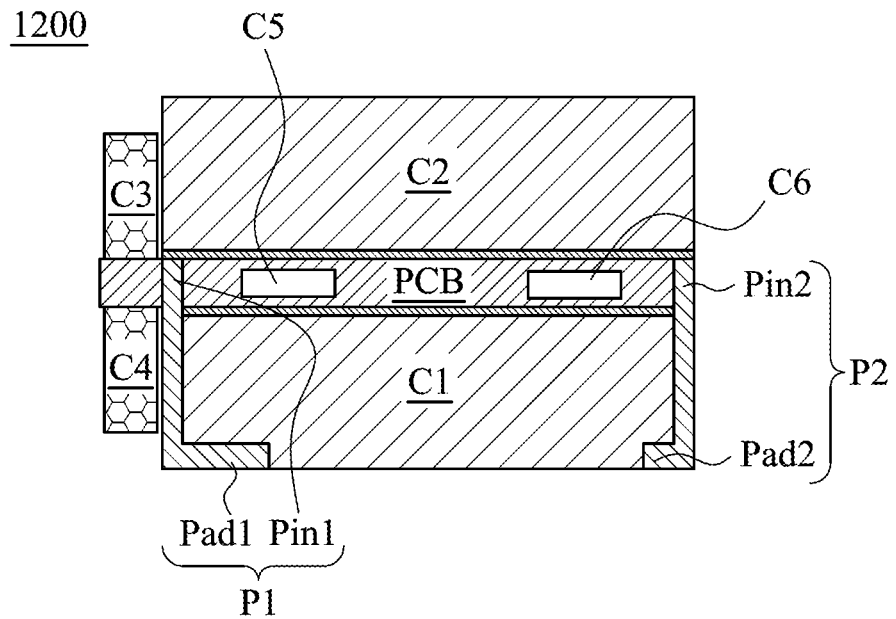
FIG. 12 illustrates a schematic diagram of a power converter in accordance with embodiments of the present disclosure.

FIG. 12 illustrates a schematic diagram of a power converter in accordance with embodiments of the present disclosure. In comparison with the power converter 200 shown in FIG. 2, the power converter 1200 of FIG. 12 further includes at least an electronic component C5 and/or C6 embedded in the carrier PCB, and thus the space utilization ratio can be further improved.

Figure 13:
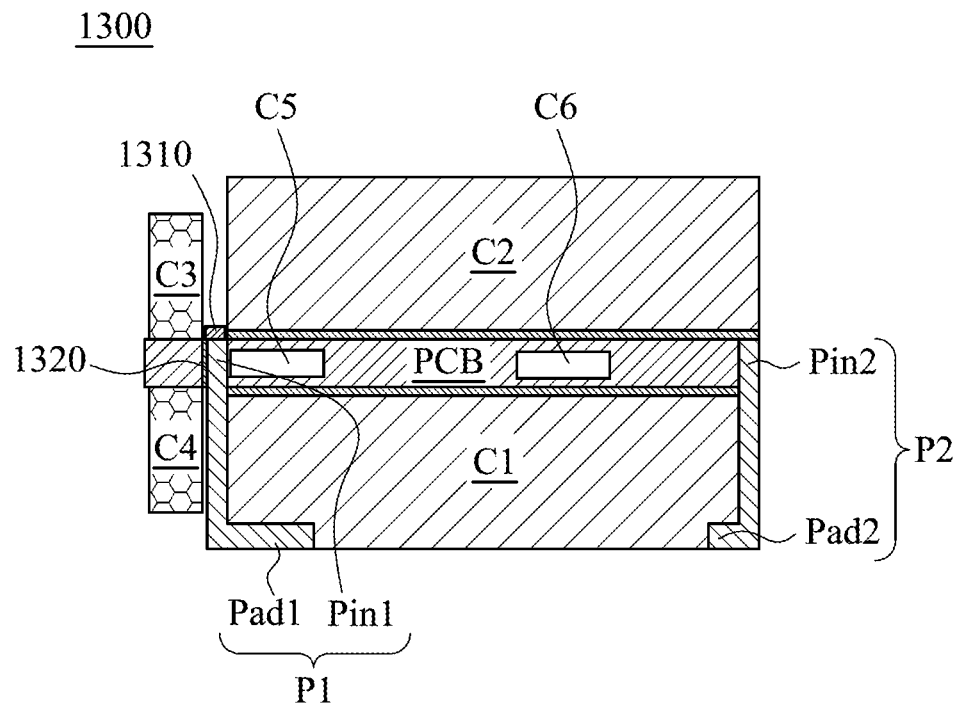
FIG. 13 illustrates a schematic diagram of a power converter in accordance with embodiments of the present disclosure.

FIG. 13 illustrates a schematic diagram of a power converter in accordance with embodiments of the present disclosure. As shown in FIG. 13, the first terminal Pint of first connection part P1 of the first electronic component C1 and the carrier PCB is connected by insertion connection, and the step of forming the insertion structure is as the following: forming a hole in the carrier PCB to make the first terminal Pin1 of the first connection part P1 penetrate through the carrier PCB; and disposing a solder block 1310 on the hole of the carrier PCB, so as to solve the problem of tin insufficiency. The reason of tin insufficiency is that, the other components on the carrier PCB are usually surface mount devices (SMD), and the soldering tin is disposed for stencil printing. Because the distance between the components could be very short, an excessive amount of soldering tin had not better to be used for ensuring solder quality; that is, the plate is made thinner and is usually between 0.1-0.2 mm. If the first terminal Pin1 and the carrier PCB is insertion connection, the hole on the carrier PCB corresponding to the first terminal Pin of the first connection part P1 needs to be bored wider for convenient installation. For example, the diameter of the hole is 2 mm greater than the diameter of the first terminal Pin1 of the first connection part P1. As such, the soldering tin for stencil printing is not sufficient to fill a gap 1320 between the first terminal Pin1 of the first connection part P1 and the hole, resulting in an excessive contact resistance. Therefore, the solder block 1310 with a corresponding volume is disposed on the hole, to compensate for tin insufficiency. It should be noted that, FIG. 13 shown a manufacturing process, the solder block 1310 has been filled into the gap 1320 in the end, and practically the solder block 1310 does not exist on the power converter 1300.

Please refer to FIG. 4, the power converter 400 may include a plurality of first terminals Pin1 and second terminals Pad1 of the first connection part P1 and a plurality of first terminals Pin2 and second terminals Pad2 of the second connection part P2, and thus the flatness of the first terminal Pin1 and the second terminal Pad1 of the first connection part P1 and the first terminal Pin2 and the second terminal Pad2 of the second connection part P2 needs to be ensured when manufacturing the power converter 400 of FIG. 4. For ensuring the flatness, the present disclosure provides a set of manufacturing processes described accompanying with FIGS. 14-22.

Figure 14:
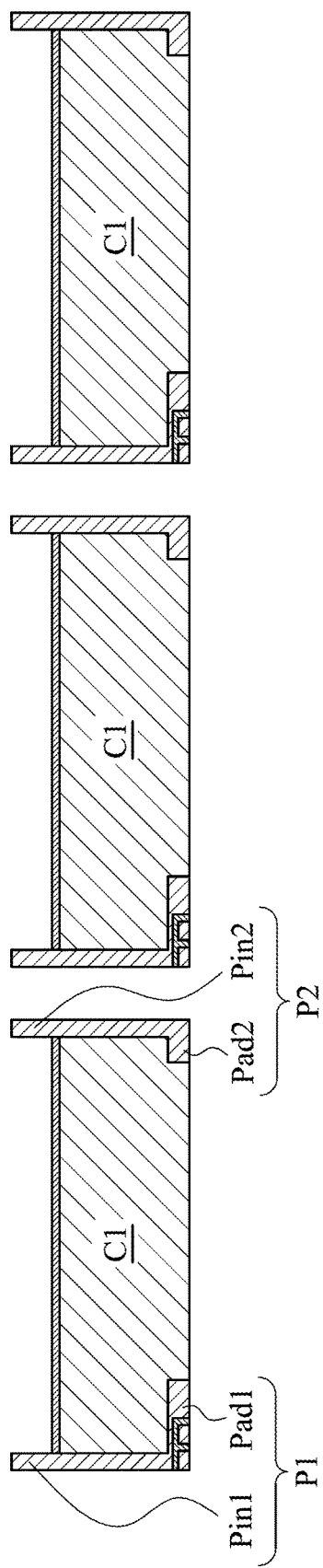
FIG. 14 illustrates a partial schematic diagram of a power converter during a process in accordance with embodiments of the present disclosure.
Figure 15:
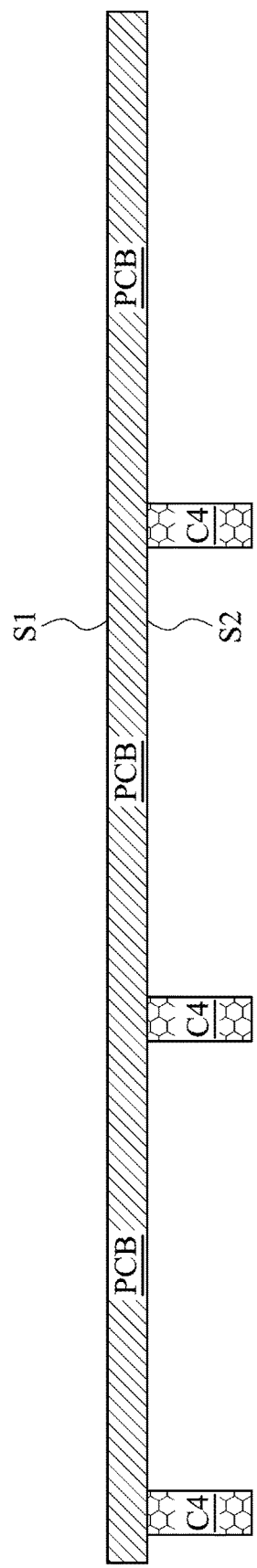
FIG. 15 illustrates a partial schematic diagram of a power converter during a process in accordance with embodiments of the present disclosure.
Figure 16:
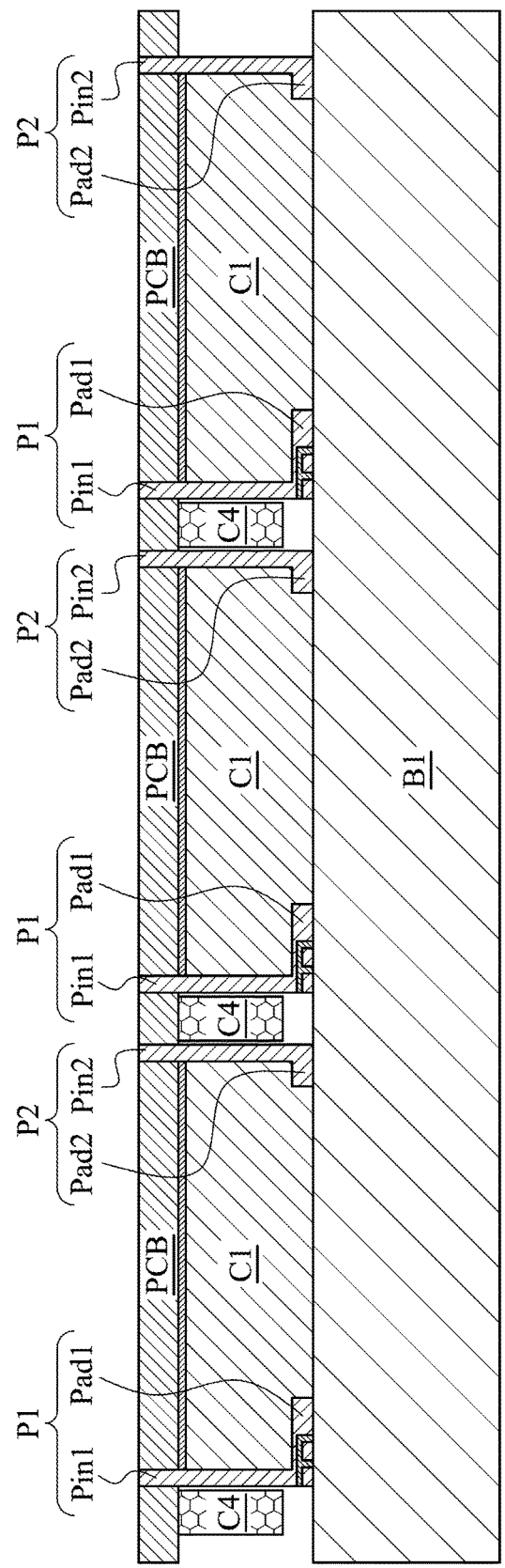
FIG. 16 illustrates a partial schematic diagram of a power converter during a process in accordance with embodiments of the present disclosure.
Figure 17:
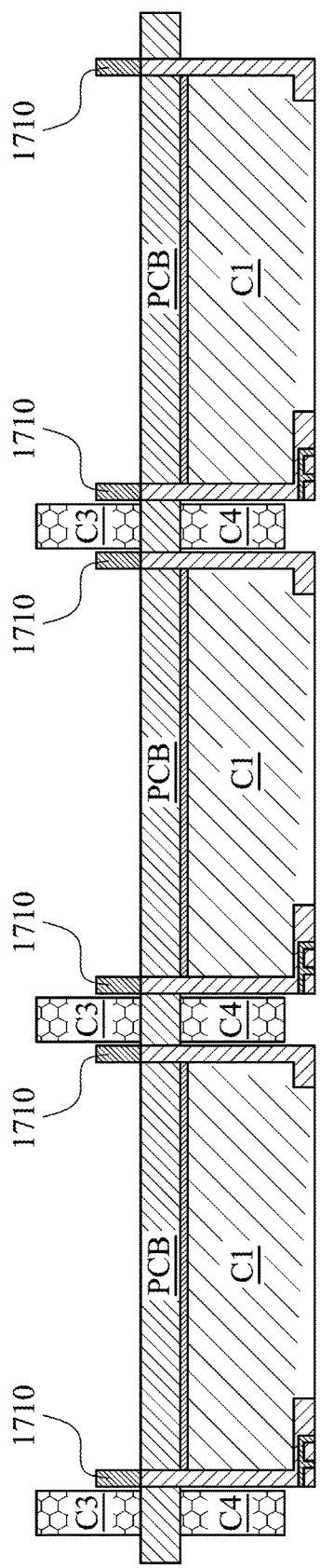
FIG. 17 illustrates a schematic diagram of a portion of a power converter during a process in accordance with embodiments of the present disclosure.
Figure 18:
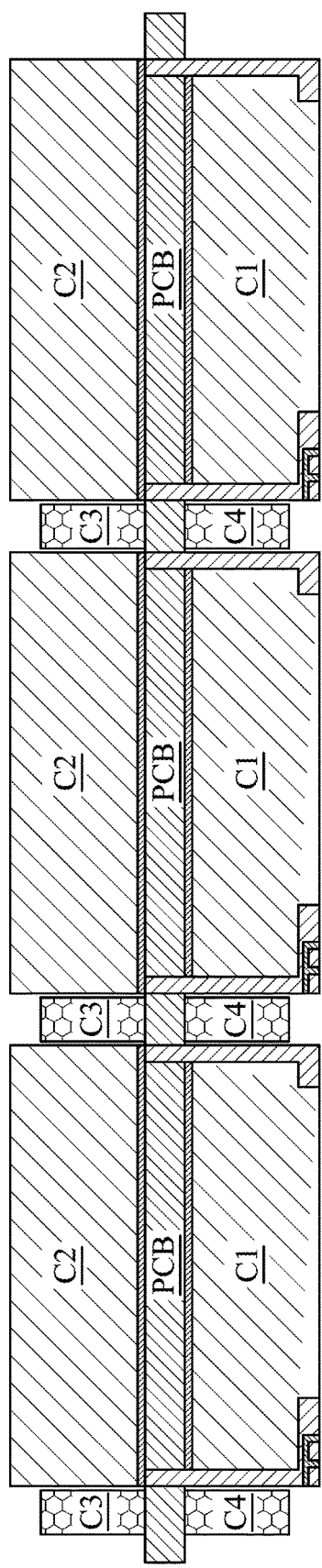
FIG. 18 illustrates a schematic diagram of a portion of a power converter during a process in accordance with embodiments of the present disclosure.

FIGS. 14-22 illustrate schematic diagrams of a portion of a power converter during a process in accordance with embodiments of the present disclosure. As shown in FIG. 14, the first electronic component C1, the first connection part P1 and the second connection part P2 of the power converter are prepared in advance and are combined into a combination structure. As shown in FIG. 15, the components electrically connected to the bottom surface S2 of the carrier PCB are installed/soldered onto the bottom surface S2 of the carrier PCB through SMT in advance. As shown in FIG. 16, glue is coated between the combination structure and the carrier PCB for corresponding inserting the combination structure into the carrier PCB and connecting the combination structure and the carrier PCB by a panel B1 of the lower surface of the combination structure with viscosity, and the flatness of the combination structure can be ensured. The first electronic component C1 of the combination structure may be a magnetic element, and thus the panel B1 may be a magnetic sucker, for generating suction between the panel B1 and the first electronic component C1 to benefit packaging. Afterwards, the glue is heated and solidified to fix the combination structure and the carrier PCB, thereby ensuring the flatness of the overall structure. After the packaging, the panel B1 may be removed depending on conditions. As shown in FIG. 17, solder paste 1710 is brushed at the surface of the carrier PCB, each component is placed, and then a soldering process is performed. As shown in FIG. 18, the second electronic component C2 is attached to the upper surface of the carrier PCB.

The power converter is completed at the step of FIG. 18, and if the molding process does not need to be performed, each power converter is obtaining by separating the pieces. If the molding process needs to be performed continuously, the processes of FIGS. 19-22 are performed continuously.

Figure 19:
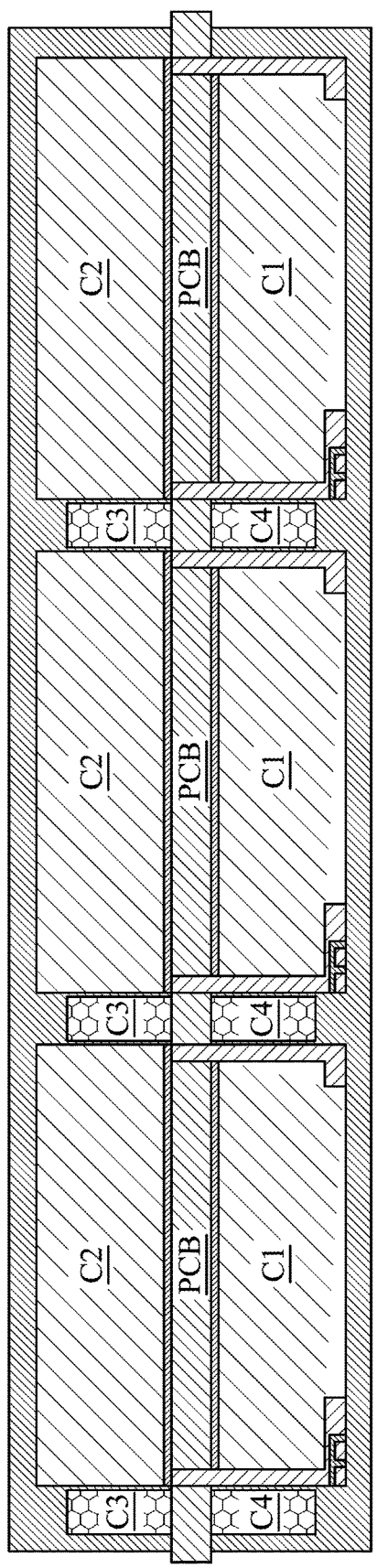
FIG. 19 illustrates a schematic diagram of a portion of a power converter during a process in accordance with embodiments of the present disclosure.
Figure 20:
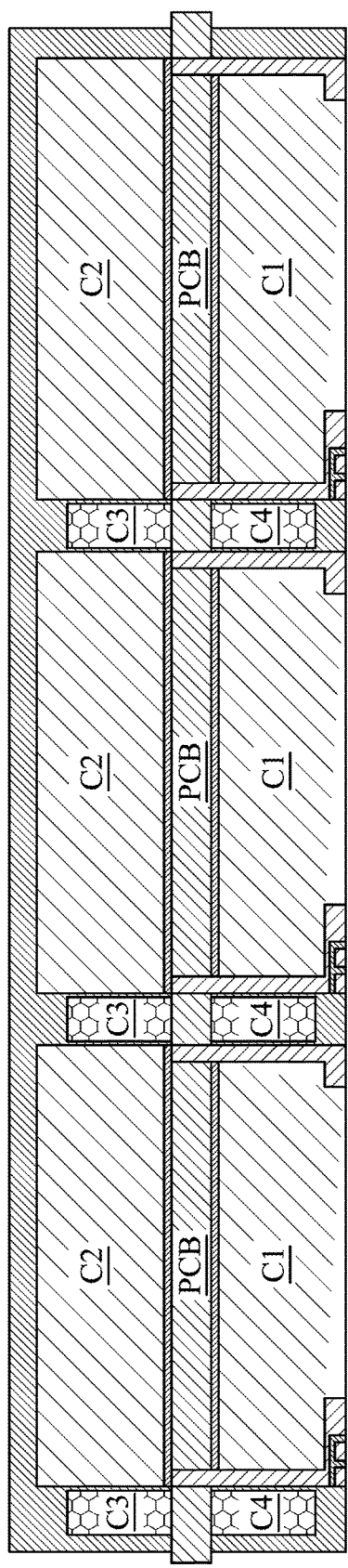
FIG. 20 illustrates a schematic diagram of a portion of a power converter during a process in accordance with embodiments of the present disclosure.
Figure 21:
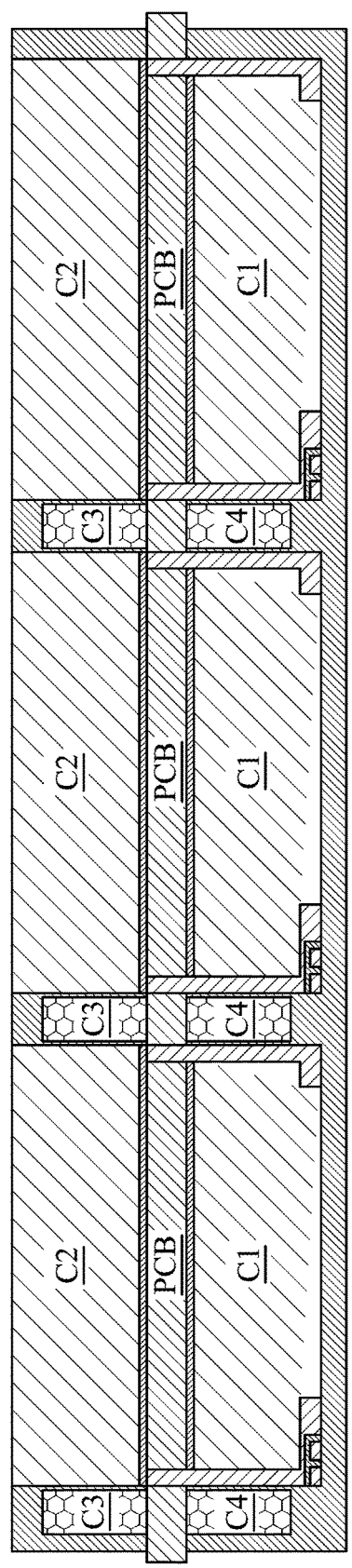
FIG. 21 illustrates a schematic diagram of a portion of a power converter during a process in accordance with embodiments of the present disclosure.
Figure 22:
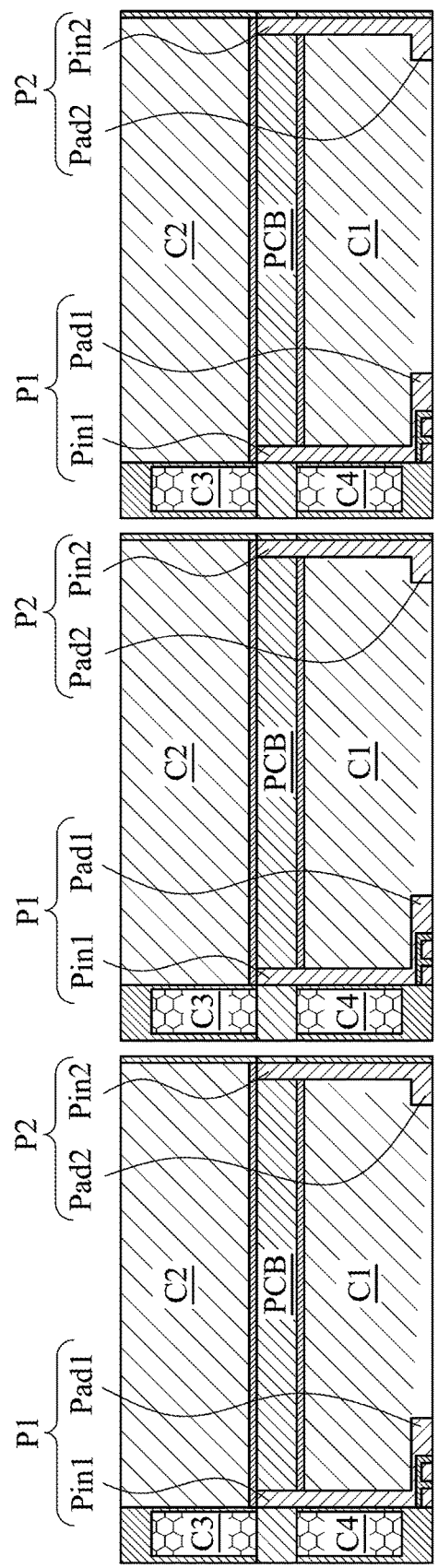
FIG. 22 illustrates a schematic diagram of a portion of a power converter in accordance with embodiments of the present disclosure.

As shown in FIG. 19, the molding process is performed with the periphery of the pieces being a pivot. The power converter of embodiments of the present disclosure is a symmetric structure, and thus the arrangement of mold cavities is quite regular, such that the mold cost is low and the molding flow is easy to be controlled, and the manufacturing yield is high, for further reducing the cost. As shown in FIG. 20, after the molding process, the glue of the lower surface may be removed by a process such as grinding, for ensuring the solderability of the lower surface. In addition, a tin plating process or a gold plating process may be performing after removing the glue, for improving the solderability of the lower surface. As shown in FIG. 21, the second electronic component C2 may be exposed by performing a grinding process to grind off the above molding material. As such, the extra volume from the molding process to the power converter can be greatly reduced. In addition, the exposed of the second electronic component C2 through a grinding process is quite flat, which is beneficial for installing a heat dissipator thereon, and the heat dissipation effect is better. As shown in FIG. 22, the power converter is separated to obtain a molded power converter by a cutting process. In addition, the cutting position can be adjusted to expose an external side of the second connection part P2 of the power converter, thereby reducing the volume of the power converter of overall molding.

FIG. 23 illustrates a flowchart of a method of fabricating a power converter in accordance with embodiments of the present disclosure. As shown in FIG. 23, the method 2300 for manufacturing a power converter of the present disclosure includes the following steps:

Step 2310: bonding a first electronic component on a lead frame, where the lead frame comprises a retaining part and a connection part;

Step 2320: cutting off the retaining part of the lead frame;

Step 2330: curving the connection part by mechanical support of the first electronic component to fix the connection part at the first electronic component;

Step 2340: connecting the first electronic component at a lower surface of the carrier; and Step 2350: bonding a second electronic component at an upper surface of the carrier to form the power converter, where the carrier is disposed at ⅓ to ⅔ of the height of the power converter.

Figure 24:
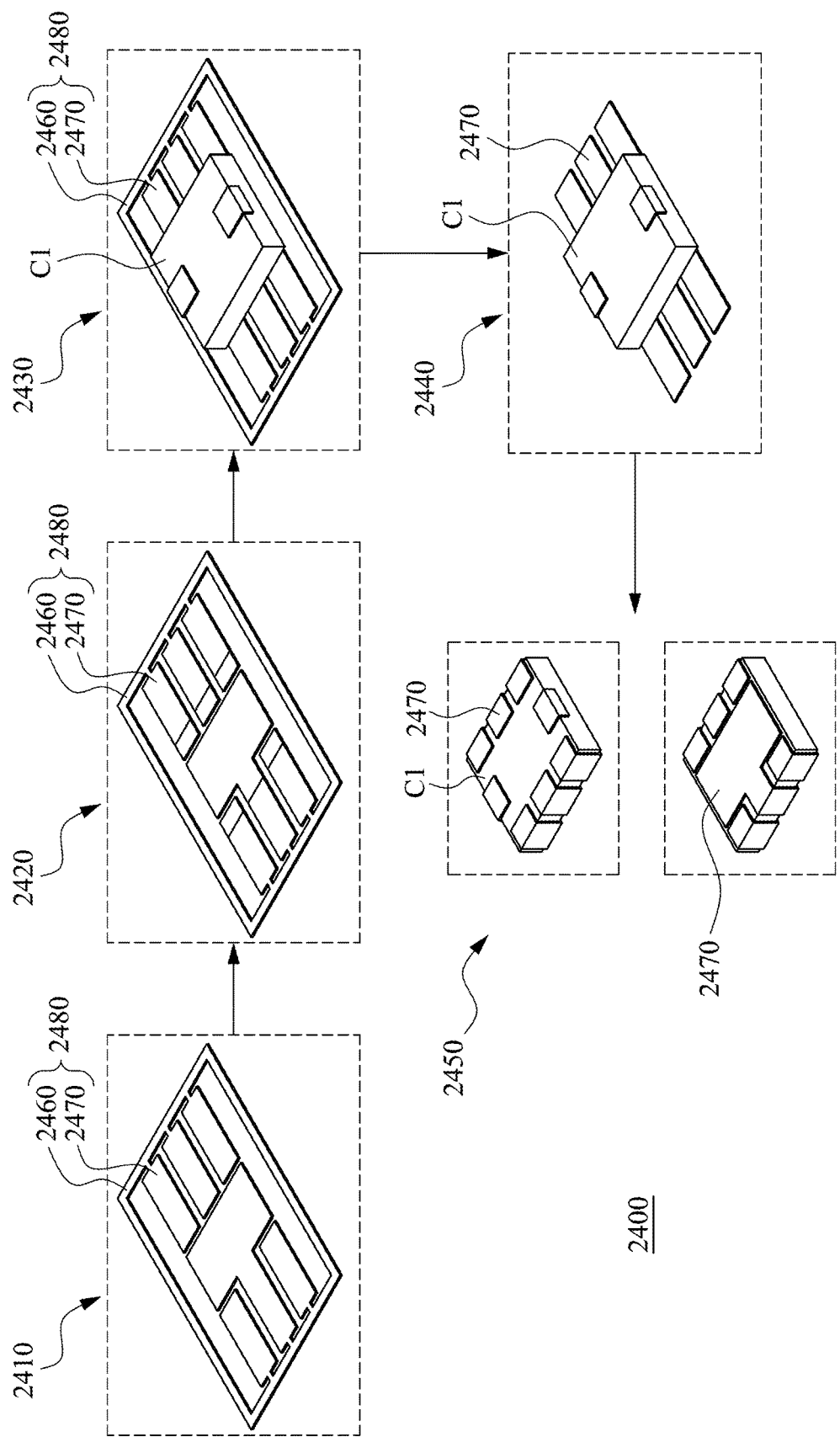
FIG. 24 illustrates a schematic diagram of a process of a power converter in accordance with embodiments of the present disclosure.

For facilitating understanding of the method for manufacturing the power converter of embodiments of the present disclosure, please also refer to FIG. 23 and FIG. 24, FIG. 24 illustrates a schematic diagram of a process of a power converter in accordance with embodiments of the present disclosure. In step 2310, please refer to the process 2430 of FIG. 24, the first electronic component C1 is mounted on a lead frame 2480, where the lead frame 2480 includes a retaining part 2460 and a connection part 2470. In step 2320, please refer to the process 2440 of FIG. 24, the retaining part 2460 of the lead frame 2480 is cut off, and only the connection part 2470 of the lead frame 2480 is left. In step 2330, please refer to the process 2450 of FIG. 24, the connection part 2470 is curved by mechanical support of the first electronic component C1, for the connection part 2470 to be fixed at the first electronic component C1. The upper and lower figures of process 2450 of FIG. 24 are respectively used to show the upper and lower surfaces of the first electronic component C1.

For facilitating understanding of the method for manufacturing the power converter of embodiments of the present disclosure, please also refer to FIG. 23, FIG. 16 and FIG. 18, in step 2340, please refer to FIG. 16 and related description, the first electronic component C1 is mounted at the lower surface of the carrier PCB. In step 2350, please refer to FIG. 18 and related description, the second electronic component C2 is mounted at an upper surface of the carrier PCB to form power converter, where the carrier PCB is disposed at ⅓ to ⅔ of the height of the power converter.

In one embodiment, please refer to FIG. 1, in the power converter 100 fabricated by the method 2300 of the present disclosure, the connection parts P1 and P2 are fabricated by mechanical support of the first electronic component C1, and thus the gap between the connection parts P1, P2 and the first electronic component C1 is close to zero. In another embodiment, the connection parts P1 and P2 may be directly bonded with the first electronic component C1 through an adhesive.

In a further embodiment, the first electronic component C1 and the second electronic component C2 are symmetric with respect to the carrier PCB. As such, the resource of the carrier PCB can be quite utilized, and the uniform strain distribution of throughout the converter can be benefited. Therefore, no additional strain solution is needed, for avoiding the problem of increasing of the power converter volume resulted from using an additional strain solution.

In a further embodiment, in comparison with the power converter 100 shown in FIG. 1, in the power converter 200 of FIG. 2 fabricated by the method 2300, the connection parts P1, P2 and the carrier PCB are connected by using insertion connection. For example, the connection parts P1 and P2 are connected to the first electronic component C1, and the connection parts P1 and P2 penetrate through the carrier PCB for being connected to the second electronic component C2. If the surface mount technology (SMT) for the connection parts P1, P2 and the carrier PCB shown in FIG. 1 is replaced by the insertion connection manner shown in FIG. 2, the connection between the connection parts P1, P2 and the carrier PCB can be more stable, so as to reduce the transmission loss from the carrier PCB to the connection parts P1 and P2, and such connection may be adapted to the conditions with low voltage and high current.

In a further embodiment, an electrical connection is not necessarily required between the connection parts P1, P2 and the first electronic component C1, and thus the first electronic component C1 may be an entire electronic component, such as a MOSFET or an integrated circuit. In addition, the first electronic component C1 may also be an entire combination of electronic components, such as a power module. Moreover, the first electronic component C1 may also include a part of a core of the magnetic element. In a further embodiment, the first electronic component C1, the second electronic component C2 and the carrier PCB are used to form an inductor element, and the first electronic component C1 and the second electronic component C2 are respectively parts of a core of an inductor element, and at this time, the power converter 200 is a boost circuit or a buck circuit.

In a further embodiment, the first electronic component C1, the second electronic component C2 and the carrier PCB are used to form a transformer, the first electronic component C1 and the second electronic component C2 are respectively parts of a core of the transformer.

In a further embodiment, in comparison with the power converter 100 shown in FIG. 1, the power converter 300 of FIG. 3 fabricated by the method 2300 further includes a third electronic component C1' and a fourth electronic component C2' respectively disposed at the bottom surface S2 and the top surface S1 of the carrier PCB, wherein the third electronic component C1', the fourth electronic component C2' and the carrier PCB are used to form a transformer, and the third electronic component C1' and the fourth electronic component C2' are respectively parts of a core of the transformer.

In a further embodiment, in comparison with the power converter 300 shown in FIG. 3, the power converter 400 of FIG. 4 fabricated by the method 2300 includes a plurality of first connection parts P1 and a plurality of second connection parts P2, where each of the first connection parts P1 includes a first terminal Pin1 and a second terminal Pad1, and each of the second connection parts P2 includes a first terminal Pin2 and a second terminal Pad2. With respect to structure, the first terminals Pin1 of the first connection parts P1 are respectively connected to the first electronic component C1 the third electronic component C1', and are connected to the carrier PCB. The second terminal Pad1 of the first connection part P1 is used to connect with an external device (not shown). The first terminals Pin2 of the second connection parts P2 are respectively connected to the first electronic component C1 and the third electronic component C1', and are connected to the carrier PCB. The second terminal Pad2 of the second connection part P2 is used to connect with an external device (not shown). As can be seen from the drawing, the power converter structure of the present disclosure is symmetric, and thus manufacturing of the first connection part P1 and the second connection part P2 of the power converter is simpler. In addition, as the power converters 300 and 400 shown in FIG. 3 and FIG. 4, in the present disclosure, the first connection part P1 and the second connection part P2 can be selectively fabricated on a single component (e.g. the first electronic component C1) or on several components (e.g. the first electronic component C1 and the third electronic component C1') according to practical needs.

In a further embodiment, the third electronic component C1' and the fourth electronic component C2' form a core of the transformer through the carrier PCB. In a further embodiment, the third electronic component C1' and the fourth electronic component C2' form an inductor core through the carrier PCB.

In a further embodiment, if the first electronic component C1 and the second electronic component C2 form a core of the transformer, and the third electronic component C1' and the fourth electronic component C2' form an inductor core, the power converter 400 includes an isolated DC/DC transformer and a buck power converter, thereby forming a two-stage architecture. Such architecture is suitable to a high input/output condition, such as 48V and 400V.

In a further embodiment, please refer to FIG. 5, the method 2300 for manufacturing a power converter of the present disclosure further includes: bonding insertion pins Pin1' and Pin2' at the connection parts P1 and P2. The insertion pins Pin1' and Pin2' are used to connect with an external device (not shown).

In a further embodiment, please refer to FIG. 6, the method 2300 for manufacturing a power converter of the present disclosure further includes: using a bracket 610 to fix the insertion pins Pin1' and Pin2'. The above step is added because the mutual location between the insertion pins Pin1' and Pin2' disposed simultaneously is more difficult. Therefore, the bracket 610 may be used to prefix the insertion pins Pin1' and Pin2', and then the insertion pins Pin1' and Pin2' are disposed on the connection parts P1 and P2 simultaneously. As such, the manufacturing difficulty can be simplified, and the accuracy may be effectively controlled. In another embodiment, please refer to FIG. 7, the method 2300 for manufacturing a power converter of the present disclosure further includes: using a bonding layer 710 to bond the first electronic component C1 and the bracket 610. As such, the insertion pins Pin1' and Pin2' can be prevented from detaching when in use.

In a further embodiment, please refer to FIG. 8, the method 2300 for manufacturing a power converter of the present disclosure further includes: performing a molding process to the power converter 800. The power converter 800 is a symmetric structure, and thus the power converter 800 is suitable for a molding process, making the structure of power converter 800 more rigid and reliable and has better heat dissipation ability. Please refer to FIG. 9, the method 2300 for manufacturing a power converter of the present disclosure further includes: performing a grinding process on a molding material 910 on the power converter 900, until a part of the power converter 900 is externally exposed. For example, the grinding process is performed on the molding material 910 on the power converter 900 to expose the second electronic component C2 and/or the first electronic component C1. Alternatively, the grinding process is performed on the molding material 910 on the power converter 900 to expose an outer side of the connection part P2, for further reducing the size and improving the heat dissipation ability of the power converter 900.

In a further embodiment, please refer to FIG. 10, the step of bonding the first electronic component C1 at the lower surface of the carrier PCB described in step 2340 includes: bonding the first surface S3 of the first electronic component C1 at the bottom surface S2 of the carrier PCB. In addition, the method 2300 for manufacturing a power converter of the present disclosure further includes: disposing a chip IC at the first electronic component C1 of the second surface S4 with glue (i.e. disposing at a surface of the first electronic component C1 apart from the carrier PCB); and disposing one or more pins (e.g. the pin Pin3) at a surface of the chip IC. As such, signals of the chip IC may be transmitted through the first connection part P1 and the second connection part P2 or through one or more pins (e.g. the pin Pin3).

In a further embodiment, please refer to FIG. 11, the connection part P1 includes a first terminal Pin1 and a second terminal Pad1, the method 2300 for manufacturing a power converter of the present disclosure further includes: disposing a flexible printed circuit board FPCB to connect the carrier PCB and the second terminal Pad1 of the connection part P1. Because signal can be transmitted from the carrier PCB to second terminal Pad1 of the first connection part P1 by the flexible printed circuit board FPCB, the problem of more signal pins can be solved. In addition, the flexible printed circuit board FPCB can be used as a connector for connecting the carrier PCB and an external device. Moreover, the aforementioned step of connecting the carrier PCB and the connection part P1 through the flexible printed circuit board FPCB includes: mounting the flexible printed circuit board FPCB at the carrier PCB through an anisotropic conductive film ACF. Because the anisotropic conductive film ACF is anisotropic conductive, if the anisotropic conductive film ACF is used to connect the flexible printed circuit board FPCB and the carrier PCB, multi-signal connection with high accuracy can be realized.

In a further embodiment, please refer to FIG. 12, the method 2300 for manufacturing a power converter of the present disclosure further includes: embedding the electronic component C5 and/or C6 in the carrier PCB. As such, the space utilization ratio can be further improved.

In a further embodiment, in the method 2300 for manufacturing the power converter 1300, the first terminal Pin1 of first connection part P1 of the first electronic component C1 and the carrier PCB is connected by using insertion connection. The step of forming the insertion structure is as the following: boring a hole in the carrier PCB for the first terminal Pin1 of the first connection part P1 to penetrate the carrier PCB through the hole; disposing a solder block 1310 on the hole of the carrier PCB; and using wave soldering or reflow soldering to fill the hole with the solder block 1310 to compensate for tin insufficiency. It should be noted that, FIG. 13 shown a manufacturing process, the solder block 1310 has been filled into the gap 1320 in the end, and actually the solder block 1310 does not exist on the power converter 1300.

In a further embodiment, please refer to FIG. 16, the first electronic component C1 is a magnetic element, and the method 2300 for manufacturing the power converter further includes: coating glue at a connecting position between the magnetic element C1 and the carrier PCB; providing a magnetic sucker B1 at a surface of the magnetic element C1 apart from the carrier PCB; sucking the magnetic element C1 and the connection part P1 by adhesive power generated by the magnetic sucker B1; heating and solidifying the coated glue to locate the magnetic element C1 and the carrier PCB.

Those skilled in the art will appreciate that each of the steps of the method 2300 for manufacturing the power converter named after the function thereof is merely used to describe the technology in the embodiment of the present disclosure in detail, but the present disclosure is not limited in this regard. Therefore, combining the steps of said method into one step, dividing the steps into several steps, or rearranging the order of the steps is within the scope of the embodiment in the present disclosure.

In view of the above embodiments of the present disclosure, it is apparent that the application of the present invention has the advantages as follows. In view of the foregoing, embodiments of the present disclosure provide a power converter and a method for manufacturing the same to improve the problems associated with the difficulty in simultaneously considering wide application range, small size, low cost and low consumption.

In addition, the power converter of the present disclosure is suitable for high power density and high efficiency condition, such as the condition in which the power density higher than 300 W/inch$^3$ and the efficiency higher than 90%. The operating frequency of the power converter of the present disclosure can be higher than 500 KHz, and the input voltage range can be between 1V-400 V. However, the method for realizing the power converter of the present disclosure is not limited to the abovementioned embodiments, which are only used for illustratively describe one of the ways for implementing the present disclosure.

Moreover, in comparison with the known art, the power converter and the method for manufacturing the same of embodiments of the present disclosure, especially the method for manufacturing the connection parts P1 and P2, have better electrical performance and thermal performance and higher power density. Furthermore, the space can be quite used and the manufacture is convenient, which are beneficial to improve the power density or the efficiency of the power converter. In addition, the concrete structure, manufacturing technique and processes shown in embodiments of the present disclosure are also quite feasible and effective. Therefore, embodiments of the present disclosure are quite suitable for improving the overall performance and the capability to price ratio of the power converter, especially the overall performance and the capability to price ratio of the POL.

It will be apparent to those skilled in the art that various modifications and variations can be made to the structure of the disclosure without apart from the scope or spirit of the present disclosure. In view of the foregoing, it is intended that the present disclosure cover modifications and variations of this disclosure provided they fall within the scope of the following claims.

What is claimed is:
1. A power converter, comprising:
   a carrier, comprising:
      an upper surface; and
      a lower surface;
   a first electronic component disposed at the lower surface of the carrier;
   a second electronic component disposed at the upper surface of the carrier; and
   a first connection part, comprising:
      a first terminal electrically coupled to the upper surface or the lower surface of the carrier; and
      a second terminal attached to a surface of the first electronic component apart from the carrier, wherein the second terminal of the first connection part is a bonding pad;
   wherein the carrier is disposed at ⅓ to ⅔ of a height of the power converter, and wherein the first connection part is fabricated by mechanical support of the first electronic component.
2. The power converter of claim 1, further comprising a plurality of first electronic components and a plurality of second electronic components, wherein a first height is defined as a vertical height between the highest one of the first electronic components and the lower surface of the carrier, a second height is defined as a vertical height between the highest one of the second electronic components and the upper surface of the carrier, and the height of the power converter is calculated by adding the first height, the second height and thickness of the carrier.
3. The power converter of claim 1, wherein a height of the first electronic component is equal to a height of the second electronic component.
4. The power converter of claim 1, wherein the first electronic component, the second electronic component and the carrier are used to form an inductive element, and the first electronic component and the second electronic component are respectively parts of a core of the inductive element.
5. The power converter of claim 4, further comprising:
   a third electronic component and a fourth electronic component respectively disposed at the lower surface and the upper surface of the carrier;
   wherein the third electronic component, the fourth electronic component and the carrier are used to form a transformer, and the third electronic component and the fourth electronic component are respectively parts of the core of the transformer.
6. The power converter of claim 1, wherein the first electronic component, the second electronic component and the carrier are used to form a transformer, and the first electronic component and the second electronic component are respectively parts of a core of the transformer.
7. The power converter of claim 1, wherein the power converter further comprises insertion pins installed at the second terminal of the first connection part for converting SMT connection to insertion connection.
8. The power converter of claim 7, further comprising a plurality of first connection parts, wherein the second terminal of the first connection parts respectively corresponds to the insertion pins, and the insertion pins are fixed through a bracket.
9. The power converter of claim 1, further comprising:
   a chip disposed at the surface of the first electronic component apart from the carrier, wherein the surface of the chip has one or more pins.
10. The power converter of claim 1, further comprising:
    a flexible printed circuit board disposed at the outer side of the first connection part, wherein one terminal of the flexible printed circuit board is connected to the carrier, the other terminal of the flexible printed circuit board is connected to the second terminal of the first connection part.
11. The power converter of claim 1, further comprising at least an electronic element embedded in the carrier.
12. A method for manufacturing a power converter, comprising:
    bonding a first electronic component on a lead frame, wherein the lead frame comprises a retaining part and a connection part;
    cutting off the retaining part of the lead frame;
    curving the connection part by mechanical support of the first electronic component to fix the connection part at the first electronic component;
    connecting the first electronic component at a lower surface of a carrier; and
    bonding a second electronic component at an upper surface of the carrier to form the power converter, wherein the carrier is disposed at ⅓ to ⅔ of a height of the power converter.
13. The method of claim 12, wherein the connection part is directly bonded with the first electronic component through an adhesive.
14. The method of claim 12, further comprising:
    penetrating the connection part through the carrier, and connecting the connection part to the second electronic component.
15. The method of claim 14, wherein the step of penetrating the connection part through the carrier comprises:
    forming a hole in the carrier to make the connection part penetrate through the carrier;
    disposing a solder block on the hole of the carrier; and
    filling the hole with the solder block by wave soldering or reflow soldering.
16. The method of claim 12, wherein the first electronic component, the second electronic component and the carrier are used to form an inductive element, and the first electronic component and the second electronic component are respectively parts of a core of the inductive element.
17. The method of claim 12, wherein the first electronic component, the second electronic component and the carrier are used to form a transformer, and the first electronic component and the second electronic component are respectively parts of a core of the transformer.

18. The method of claim 12, further comprising:
bonding an insertion pin at a terminal of the connection part.

19. The method of claim 12, further comprising:
bonding a first surface of the first electronic component at the lower surface of the carrier;
disposing a chip at a second surface of the first electronic component with glue; and
disposing one or more pins at a surface of the chip.

20. The method of claim 12, further comprising:
disposing a flexible printed circuit board to connect the carrier and a second terminal of the connection part.

21. The method of claim 12, further comprising:
performing a molding process on the power converter; and
performing a grinding process on a molding material on the power converter, until a part of the power converter is externally exposed.

22. The method of claim 12, wherein the first electronic component is a magnetic element, the method further comprising:
coating glue at a connecting position between the magnetic element and the carrier;
providing a magnetic sucker at a surface of the magnetic element apart from the carrier;
sucking the magnetic element and the connection part by adhesive power generated by the magnetic sucker; and
heating and solidifying the coated glue to locate the magnetic element and the carrier.

23. The method of claim 22, further comprising:
performing a molding process on the power converter; and
performing a grinding process on a molding material of the power converter to expose the second electronic component and/or the first electronic component.

24. The method of claim 22, further comprising:
performing a molding process on the power converter; and
performing a grinding process on a molding material on the power converter to expose an outer side of the connection part.

* * * * *